United States Patent [19]

Palmieri et al.

[11] Patent Number: 5,789,288
[45] Date of Patent: Aug. 4, 1998

[54] PROCESS FOR THE FABRICATION OF SEMICONDUCTOR DEVICES HAVING VARIOUS BURIED REGIONS

[75] Inventors: Michele Palmieri, Settimo Milanese; Paola Galbiati; Lodovica Vecchi, both of Monza, all of Italy

[73] Assignee: SGS-Thomson Microelectronics S.r.l., Agrate Brianza, Italy

[21] Appl. No.: 854,584

[22] Filed: May 12, 1997

[51] Int. Cl.$^6$ ............................................... H01L 21/8249
[52] U.S. Cl. .......................... 438/234; 438/220; 438/294; 438/356; 438/414
[58] Field of Search ........................... 438/234, 218, 438/220, 294, 353, 356, 357, 358, 414

[56] References Cited

U.S. PATENT DOCUMENTS

| | | | |
|---|---|---|---|
| 4,404,738 | 9/1983 | Sasaki et al. | 438/357 |
| 4,456,488 | 6/1984 | Gahle | 438/356 |
| 5,110,749 | 5/1992 | Ikeda . | |
| 5,330,922 | 7/1994 | Erdeljac et al. . | |
| 5,556,796 | 9/1996 | Garnett et al. | 438/356 |

FOREIGN PATENT DOCUMENTS 0 032 550  7/1981  European Pat. Off. .
0 339 637  11/1989  European Pat. Off. .

*Primary Examiner*—Tuan H. Nguyen
*Attorney, Agent, or Firm*—Jenkens & Gilchrist; Raymond M. Galasso

[57] ABSTRACT

A process for doping a P-type substrate (50) by forming a layer (52) of silicon nitride, implanting N-type impurities through this layer (FIG. 7), forming a resist mask (54) which leaves at least one area of the substrate (FIG. 8) containing a part of the nitride layer exposed, implanting N-type impurities first with an insufficient energy and then with a sufficient energy to traverse the nitride layer, subjecting (FIG. 9) the substrate to a high temperature treatment in an oxidizing environment to form silicon dioxide pads (55) on the areas of the substrate not covered by the nitride layer, removing the nitride layer and performing an implantation of P-type impurities into the areas delimited by the pads. The process then continues with the removal of the pads and, in the conventional manner, with the formation of an epitaxial layer and selective doping of this to form P-type and N-type regions in it. The process described allows the production of integrated devices with an additional buried layer while utilizing one fewer mask than conventional processes.

5 Claims, 2 Drawing Sheets ically, the present invention provides a process for the fabrication of an integrated semiconductor device on a substrate of monocrystalline silicon of a first conductivity type. The process comprises the steps of introducing into the substrate doping impurities of a first and a second type through first and second areas, respectively, of a surface of the substrate; subjecting the substrate to epitaxial growth at high temperature to form on its surface an epitaxial layer which delimits substrate buried regions of the first type of conductivity and a second type of conductivity opposite the first, by diffusion of the impurities introduced into the substrate; and selectively doping the epitaxial layer in such a way as to form in it a multiplicity of regions of first and second conductivity type. The step of introducing doping impurities of the first and second type into the substrate comprises the following steps: forming a silicon nitride layer on the surface of the substrate, which leaves areas of the substrate exposed; introducing doping impurities of the second type through the areas left exposed by the nitride layer; forming a mask of a material impermeable to the implantation of ions which leaves at least one area of the substrate containing a part of the nitride layer exposed; performing a first ion implantation of doping impurities of-->

PROCESS FOR THE FABRICATION OF SEMICONDUCTOR DEVICES HAVING VARIOUS BURIED REGIONS

FIELD OF THE INVENTION

The present invention relates to processes for the production of semiconductor devices and more particularly to a process for the fabrication of an integrated semiconductor device on a substrate of monocrystalline silicon of a first conductivity type.

BACKGROUND OF THE INVENTION

Various techniques are known for producing a wide variety of electronic components in the same silicon wafer, having very different geometries and functional characteristics. These techniques produce integrated devices comprising circuits for processing both digital and analog signals operating with CMOS field-effect transistors or low power bipolar transistors, and circuits for the control of external loads comprising both field-effect and bipolar transistors.

Devices of this general type require structures comprising various buried regions, that is to say regions entirely immersed in the silicon, which are different both in conductivity type, that is to say of N-type or P-type, and in resistivity, that is to say having higher or lower concentrations of impurities. These regions are often called buried layers, especially when their thickness is very much less than their lateral extent.

A known process for the formation of three different buried layers is described in detail hereinbelow. As will be seen, this known process requires a separate masking operation for the formation of each buried layer. Each of these operations takes place over various phases which require repeated manipulations and stresses of the silicon wafer in which a large number of integrated devices are to be formed. Since each of these phases contributes to an increase in the risk of breakage of the wafer and to introduce into the structure being worked defects which lower the production yield, a reduction in the number of masking operations is desirable.

SUMMARY OF THE INVENTION

Accordingly, the present invention provides a process for the fabrication of an integrated semiconductor device on a substrate of monocrystaline silicon of a first conductivity type. The process comprises the steps of introducing into the substrate doping impurities of a first and a second type through first and second areas, respectively, of a surface of the substrate; subjecting the substrate to epitaxial growth at high temperature to form on its surface an epitaxial layer which delimits substrate buried regions of the first type of conductivity and a second type of conductivity opposite the first, by diffusion of the impurities introduced into the substrate; and selectively doping the epitaxial layer in such a way as to form in it a multiplicity of regions of first and second conductivity type. The step of introducing doping impurities of the first and second type into the substrate comprises the following steps: forming a silicon nitride layer on the surface of the substrate, which leaves areas of the substrate exposed; introducing doping impurities of the second type through the areas left exposed by the nitride layer; forming a mask of a material impermeable to the implantation of ions which leaves at least one area of the substrate containing a part of the nitride layer exposed; performing a first ion implantation of doping impurities of the second type with an energy insufficient to traverse said part of the nitride layer but sufficient to introduce ions into the substrate through the remaining parts of said at least one area of the substrate containing a part of the nitride layer; performing a second ion implantation with doping impurities of the second type with an energy sufficient to traverse said part of the nitride layer in such a way as to introduce ions into the substrate through said at least one area of the substrate containing a part of the nitride layer; removing the mask; subjecting the substrate to a high temperature treatment in an oxidizing environment to form pads of silicon dioxide on the areas of the substrate not covered by the nitride layer; removing the nitride layer to expose areas of the substrate delimited by the pads; performing a third ion implantation of doping impurities of the first type with an energy insufficient to traverse the silicon dioxide pads but sufficient to introduce ions into the areas of the substrate delimited by the pads; and removing the silicon dioxide pads.

The present invention provides the advantage of reducing the number of masking operations required to form buried regions and provides the designer with greater range of choices in the formation of the buried regions.

BRIEF DESCRIPTION OF THE DRAWINGS

The invention will be better understood from the following detailed description of an embodiment in relation to the attached drawings, in which.

DETAILED DESCRIPTION OF A PREFERRED EMBODIMENT OF THE INVENTION

Figure 1:
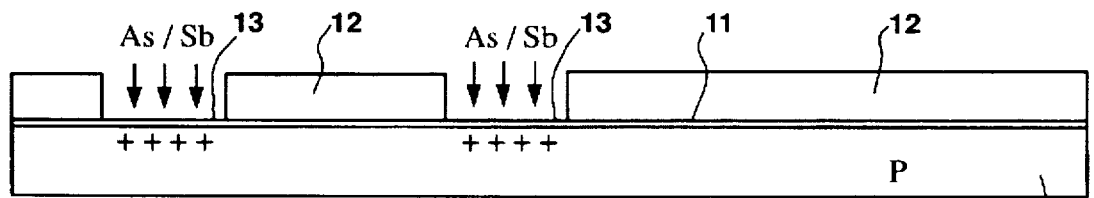
FIGS. 1–6 are sections which show a part of a silicon chip in various successive fabrication stages of a known process.

With reference first to FIG. 1, a substrate of monocrystaline silicon of P-type conductivity is indicated as reference numeral 10. A thin layer 11 (20–30 nm) of silicon dioxide is grown at high temperature on substrate 10. A mask 12 of "resist" is formed on layer 11 using well-known photolithographic techniques, in such a way as to define exposed surface regions or windows 13 over several surface regions. Although two windows 13 are shown in FIG. 1, any number of windows can be defined. Masked substrate 10 is then subjected to an operation of implantation with ions of arsenic and antimony (As/Sb) in high doses (at least $10^{15}$ cm$^{-2}$) with an energy lying between 60 and 100 KeV. The ions are blocked by mask 12 but easily traverse layer 11 which, as is known, has the function of preventing the surface of the monocrystaline silicon, from being subject to damage to its superficial crystalline structure by the effect of implantation. In the silicon, under the exposed surface regions 13, strongly doped N-type implanted regions are formed as indicated with a series of + signs.

Figure 2:
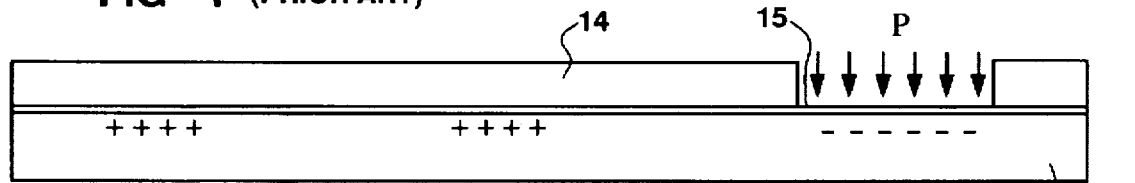

Resist mask 12 is then removed and another mask 14 is formed as shown in FIG. 2 which defines exposed surface regions or apertures 15 on other surface regions of substrate 10, there being only one shown. With a further implantation operation, this time with ions of phosphorus (P) in moderate doses, that is to say lying between $5 \times 10^{13}$ and $5 \times 10^{14}$ cm$^{-2}$, and with an energy lying between 60 and 200 KeV, under the exposed surface regions 15, moderately doped N-type implanted regions are formed as indicated with a series of − signs.

Figure 3:
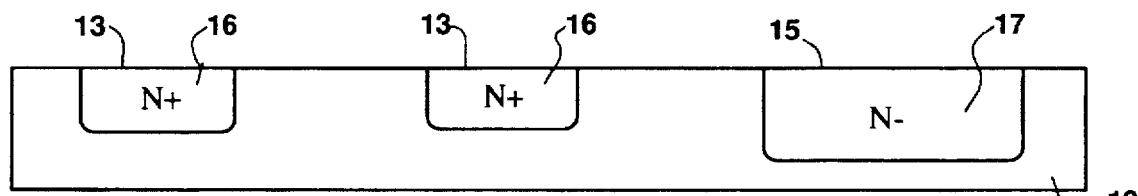
Figure 6:
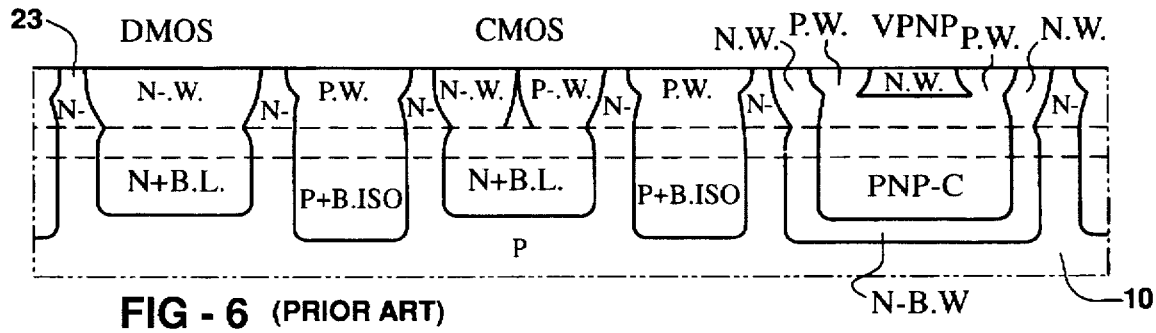

After removal of mask 14, the substrate 10 is heated to a high temperature (1100°–1200° C.) for a time sufficient to allow the implanted ions to diffuse to a predetermined depth as is shown in FIG. 3. At surface regions 13, regions 16 of strongly doped N conductivity type indicated as N+ are formed to constitute the buried layers of several integrated components such as DMOS transistors and pairs of complementary CMOS transistors (as shown in FIG. 6) and, at the surface regions 15, regions 17 of moderately doped N conductivity type indicated as N- are formed to constitute buried layers which delimit wells for containment of other integrated components, for example vertical PNP transistors VPNP (as shown in FIG. 6).

Figure 4:
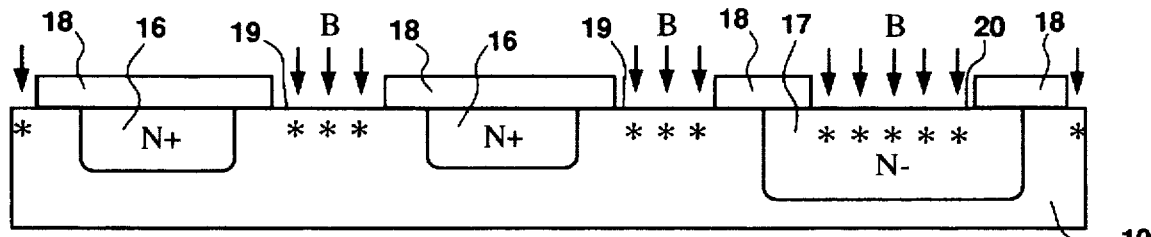

There is then formed a third mask 18 of resist as shown in FIG. 4, which defines windows or surface areas 19, of substrate 10, which separate from one another the regions intended to contain separate components, and windows or surface areas 20 of substrate 10, within the surface area of region 17. Masked substrate 10 is then subjected to implantation with boron ions (B) in doses lying between $1\times10^{14}$ and $1\times10^{15}$ cm$^{-2}$ with an energy lying between 25 and 200 KeV in such a way as to form strongly doped P-type implanted regions as indicated with a series of * signs.

Figure 5:
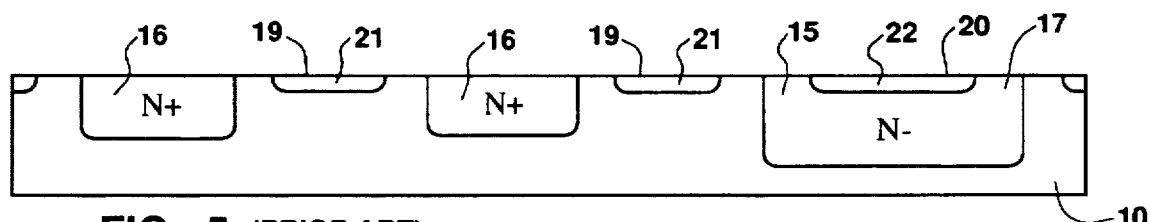

Third mask 18 is then removed and substrate 10 is heated to a temperature (500°–600° C.) such as to allow a preliminary diffusion (annealing) of the implanted boron ions forming P-type regions 21, 22 in the surface areas 19, 20 as shown in FIG. 5.

The process proceeds with the formation, by growing at high temperature on the monocrystaline silicon substrate 10, of an epitaxial layer 23 of N conductivity type. This operation, in this example, takes place in two phases and is accompanied by various selective doping and diffusion operations. A structure such as that shown in FIG. 6 is thus obtained. In this structure three types of buried regions can be recognized, formed by the effect of the above-described operations: buried layers N+ indicated as N+B.L, which originated from regions 16; the buried layer N- indicated as N-B.W, which originated from region 17; and the deep insulation regions P+ indicated as P+B.ISO which originated from regions 21. These buried regions are formed by diffusion both in substrate 10 and in the parts of epitaxial layer 23 which are formed in the first epitaxial growth phase.

In the example shown in FIG. 6, an N region indicated as N–W is formed in the part of epitaxial layer 23 overlying one buried layer N+B.L to contain a DMOS transistor. In another part of the epitaxial layer 23 overlying another buried layer N+B.L are formed both another N region, again indicated N–W and a P region, indicated P–W to contain, respectively, a P channel MOS transistor and an N channel MOS transistor of a pair of CMOS transistors. Within the buried layer N–B.W, a P region, as indicated by PNP-C in FIG. 6, is formed by diffusion from region 22 (as shown in FIG. 5). Region PNP-C extends into part of the epitaxial layer formed in the first growth phase. Above the buried layer N–B.W, in the epitaxial layer 23, is formed an N region, as indicated by N.W, to complement the insulation well of a vertical PNP transistor VPNP. Within this region N.W is formed a P region indicated P.W to constitute a region of deep contact with the collector region PNP-C of the vertical PNP transistor. Similar P regions, also indicated P.W, are formed above the regions P+B.ISO and join with these to insulate the various components of the integrated device from one another.

The structure is then subjected to further operations, well known to those skilled in the art, to obtain a complete electronic device.

The process according to the invention is now described with reference to FIGS. 7–10. On a monocrystaline silicon substrate 50 of P conductivity type, a thin layer 51 of silicon dioxide is formed by growing at high temperature, the function of which was explained in connection with the known process illustrated in FIGS. 1–6 and which is not necessary to put the process according to the invention into practice. On thin layer 51 is deposited a layer of silicon nitride 52 of thickness lying between 60 and 120 nm. A mask 53 of resist is then formed on nitride layer 52 in such a way as to cover some surface areas of nitride layer 52 leaving others thereof exposed. A chemical attack removes the nitride from the exposed areas and substrate 50 with nitride layer 52, and resist mask 53 is subjected to an implantation of ions of doping impurity of N-type, in this case phosphorus (P) with relatively low doses ($1-5\times10^{13}$ cm$^{-2}$) and with an energy lying between 25 and 200 KeV. Under the surface areas of silicon substrate 50 left exposed by mask 53 that is to say covered only by the thin layer of silicon dioxide 51, are formed implanted regions of lightly doped N-type indicated with a series of – signs in FIG. 7.

Figure 8:
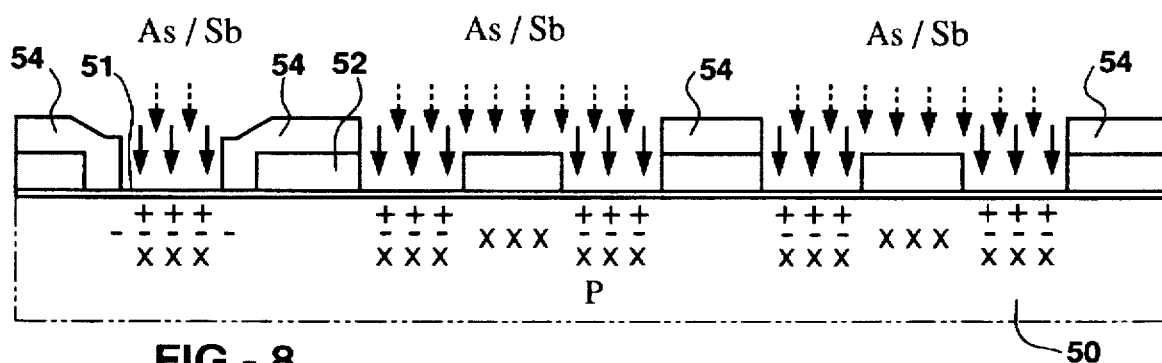

As shown in FIG. 8, the resist mask 53 which covers the nitride layer 52 is then removed and another resist mask 54 is formed, the thickness of which is such as to be impermeable to subsequent ion implantations. Mask 54 covers some of the areas of substrate 50 left exposed by mask 53 and parts of nitride layer 52.

Masked substrate 50 is then subjected to a first implantation operation with ions of N-type doping impurity, in this case doping at low diffusivity such as arsenic and antimony (As/Sb) with a relatively high dose ($10^{15}-10^{16}$ cm$^{-2}$) and an energy value chosen in such a way that the ions do not succeed in traversing the parts of the nitride layer 52, whether or not they are covered by the resist mask 53, but succeed in implanting into the substrate zone covered only by thin oxide layer 51. There are thus formed implanted N-type regions doped more heavily than the previously implanted N regions as indicated in FIG. 8 with a series of + signs.

With the same mask 54, a second implantation operation is performed with ions of N-type doping impurity, in this case again with ions of As/Sb in moderate doses ($5\times10^{13}-5\times10^{14}$ cm$^{-2}$) and with a sufficiently high energy (200–500 KeV) as to traverse the parts of nitride layer 52 not covered by resist mask 54. The N regions previously implanted with As/Sb ions are thereby further doped and new regions of N-type are formed in substrate 50 under the parts of nitride layer 52 not covered by resist mask 54 as represented by a series of × signs. It is noted that the order of the two implantation operations can be reversed obtaining substantially the same results.

Figure 9:
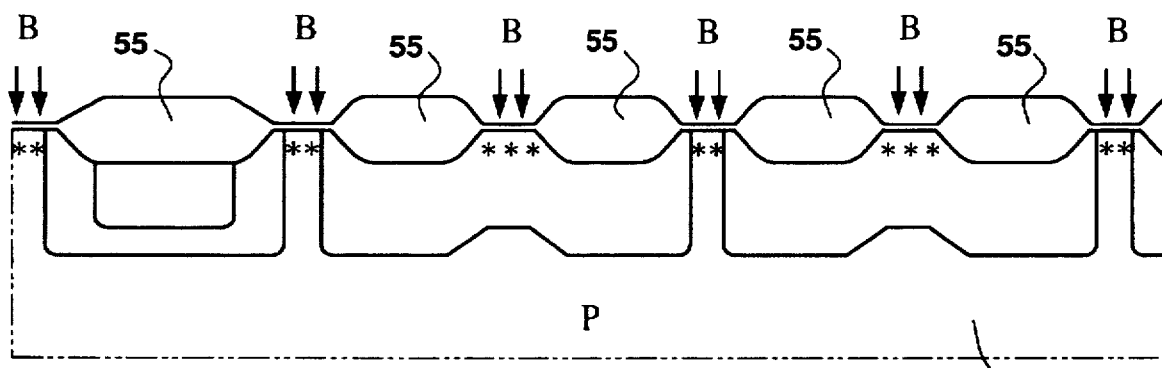

Referring now to FIG. 9, the process according to the present invention will be described further. After removing resist mask 54, substrate 50 covered by nitride layer 52 is subjected to a high temperature treatment (such as 1100°–1200° C.) in an oxidizing environment for a period of time (such as 1–3 hours) sufficient to form relatively thick pads 55 (such as 300–1000 nm) of silicon dioxide on the areas of substrate 50 not covered by nitride layer 52 and to make the previously-implanted impurities diffuse into substrate 50. As is known to the man skilled in the art, since the silicon dioxide grows at the expense of the underlying silicon, at the end of the treatment pads 55 are partly embedded in substrate 50.

The nitride layer 52 is then removed and the structure is subjected to a third implantation operation, this time with doping impurities of opposite type from those of the preceding implantations. In this example boron is utilized in doses of a value chosen between $1\times10^{13}$ and $1\times10^{15}$ cm$^{-2}$ and at low energy (such as 25–50 KeV). Oxide pads 55 constitute a barrier to implantation so that the ions penetrate only in the areas of substrate 50 between pads 55 forming P-conductivity regions as indicated with a series of * signs in FIG. 9. The structure is then subjected to a short heat treatment (annealing) and the process then proceeds with the removal of oxide pads 55, the formation of an epitaxial layer 10 and various selective doping operations in the same way as briefly described with reference to the known process illustrated in FIGS. 1–6 to obtain the structure shown in FIG. 10.

Figure 7:
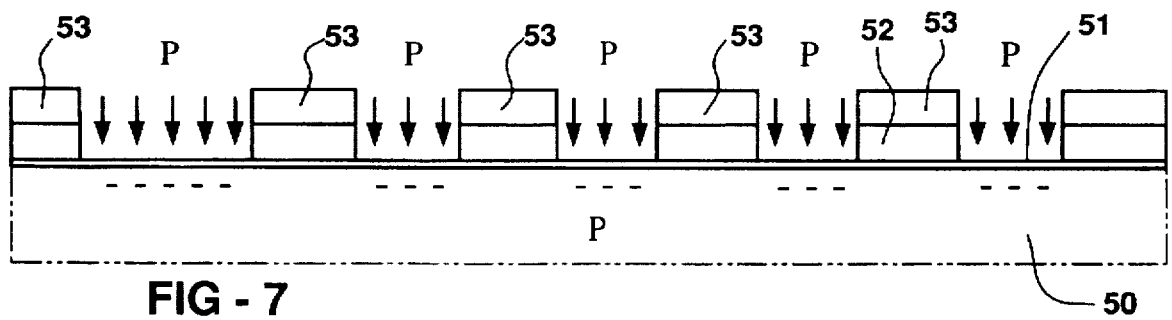
FIGS. 7–10 are sections which show a part of a silicon chip in various successive fabrication stages of the process according to the invention.
Figure 10:
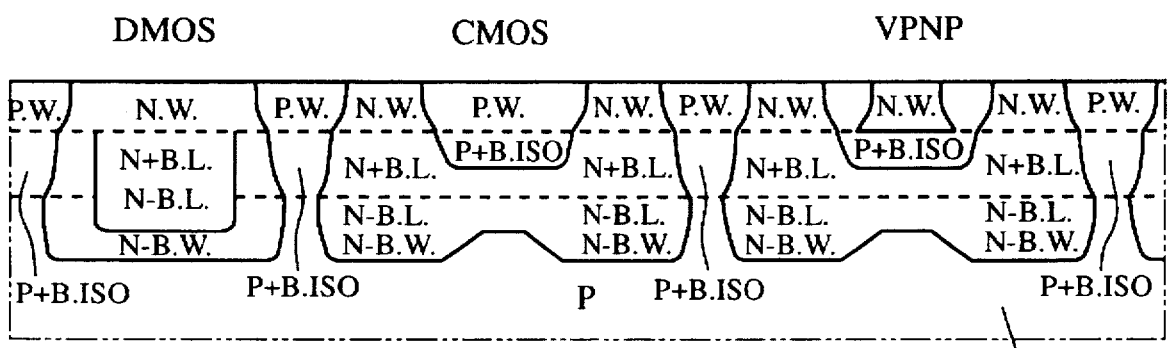

As is seen in FIG. 10, four types of buried regions can be recognized in the structure, formed by the above-described operations: the buried N+ layers, indicated as N+B.L, which originate from the regions indicated with the + signs in FIG. 8; the buried N-wells, indicated as N–B.W which originate from the regions indicated with the – signs in FIGS. 7 and 8; buried N- layers indicated as N–B.L, which originate from the regions indicated with × signs in FIG. 8; and the deep insulation regions P+ indicated as P+B.ISO, which originate from the regions indicated with * signs in FIG. 9. These buried regions form, as already indicated above in relation to the known process illustrated in FIGS. 1–6, by diffusion both into substrate 50 and into the epitaxial layer.

With this example of the process according to the invention is obtained a structure which, like the structure of FIG. 6 obtained with the known process, is intended to contain a DMos transistor, a CMOS pair and a vertical PNP transistor VPNP. As distinct from the structure of FIG. 6, the DMOS transistor has a buried well of N-type less doped at its edges so that it is able to support higher voltages, the CMOS pair has a P-type well formed in part by a buried region P+B.ISO obtained with the same formation operations as the deep insulation regions, and an N-type well with variable distribution of concentrations of the impurities particularly favorable to a good insulation against the adjacent P+ regions and to an optimum immunity to the phenomenon known as "latch up" due to the formation of a parasitic thyristor. A similar N-type well effectively insulates the vertical PNP transistor.

In this case, too, the structure is then subjected to further treatments known to the man skilled in the art in order to obtain a complete electronic device.

From a comparison with the known process it can be recognized that, to obtain the three buried regions, that is to say the buried strongly doped N-type layer (N+B.L) the P-type deep insulation region (P+B.ISO) and the moderately doped N-type buried layer (N–B.W) with the known process three resist masks were necessary (12, FIG. 1; 14, FIG. 2 and 18, FIG. 4) while with the process according to the invention two such masks are sufficient, that is to say mask 53 in FIG. 7 which also serves for the definition of the silicon nitride layer 52, and mask 54 in FIG. 8. This constitutes a considerable simplification of the process and thus an advantage in terms of overall yield. It is also recognized that the process according to the invention makes available a further buried layer that is to say the moderately doped buried layer indicated N–B.W, which constitutes a real advantage in terms of design versatility.

The process according to the invention also provides a significant advantage in terms of saving of area. In fact, the buried insulation region (P+B.ISO) is self-aligned with the buried N-type regions (N+B.L and N–B.W) so that there is no loss of area due to the necessity of taking into account the alignment tolerances of the masks as in the known process. An area saving also arises for another reason. With the known process, in order to obtain an effective insulation of the buried N-type regions it is necessary that the buried P-type insulation regions be spaced from these in such a way as to leave lightly doped silicon, that is to say that of the substrate or of the epitaxial layer, between regions to be insulated and insulating regions. Therefore it is necessary that resist mask 18 in FIG. 4 extends beyond the edges of regions 16 and 17. With the process according to the invention this requirement does not exist because the quality of the insulation is optimized by using lower concentrations of doping impurities for the buried N-type regions of those devices which must support higher voltages. This is made possible by the fact that according to the invention there is available a further implantation phase to obtain buried lightly doped N-type regions (N–B.W)

Although the present invention and its advantages have been described in detail, it should be understood that various changes, substitutions and alterations can be made herein without departing from the spirit or scope of the invention as defined in the appended claims.

What is claimed is:

1. A process for the fabrication of an integrated semiconductor device on a substrate of monocrystaline silicon of a first conductivity type, said process comprising the steps of:

introducing into the substrate doping impurities of a first and a second type through first and second areas, respectively, of a surface of the substrate;

subjecting the substrate to epitaxial growth at high temperature to form on its surface an epitaxial layer which delimits substrate buried regions of the first type of conductivity and a second type of conductivity opposite the first, by diffusion of the impurities introduced into the substrate;

selectively doping the epitaxial layer in such a way as to form in it a multiplicity of regions of first and second conductivity type; and wherein said step of introducing doping impurities of the first and second type into the substrate comprises the following steps:

forming first a silicon nitride layer on the surface of the substrate, which leaves areas of the substrate exposed;

introducing doping impurities of the second type through the areas left exposed by the nitride layer;

forming a mask of a material impermeable to the implantation of ions which leaves at least one area of the substrate containing a part of the nitride layer exposed;

performing a first ion implantation of doping impurities of the second type with an energy insufficient to traverse said part of the nitride layer but sufficient to introduce ions into the substrate through the remaining parts of said at least one area of the substrate containing a part of the nitride layer;

performing a second ion implantation with doping impurities of the second type with an energy sufficient to traverse said part of the nitride layer in such a way as to introduce ions into the substrate through said at least one area of the substrate containing a part of the nitride layer;

removing the mask;

subjecting the substrate to a high temperature treatment in an oxidizing environment to form pads of silicon dioxide on the areas of the substrate not covered by the nitride layer;

removing the nitride layer to expose areas of the substrate delimited by the pads;

performing a third ion implantation of doping impurities of the first type with an energy insufficient to traverse the silicon dioxide pads but sufficient to introduce ions into the areas of the substrate delimited by the pads; and removing the silicon dioxide pads.

2. A process, according to claim 1, wherein the first implantation is performed before the second implantation.

3. A process, according to claim 1, wherein the first implantation is performed after the second implantation.

4. A process, according to claim 1, wherein before the operation of introducing doping impurities of the first type and of the second type into the substrate there is formed a thin layer of silicon dioxide on the surface of the substrate, which is removed before subjecting the substrate to epitaxial growth.

5. A process, according to claim 1, wherein the formation of the nitride layer comprises the formation of a second mask of material impermeable to ion implantation over a portion of the nitride layer.

* * * * *

UNITED STATES PATENT AND TRADEMARK OFFICE
CERTIFICATE OF CORRECTION

PATENT NO. : 5,789,288  
DATED : August 4, 1998  
INVENTOR(S) : Michele Palmieri, et al Page 1 of 2

It is certified that error appears in the above-identified patent and that said Letters Patent is hereby corrected as shown below:

On the title page the following should be inserted:

[30]     Foreign Application Priority Data

May 14, 1996  [EP]  European Pat. Off. . . . . . . . . 96830280.2

UNITED STATES PATENT AND TRADEMARK OFFICE
CERTIFICATE OF CORRECTION

PATENT NO. : 5,789,288
DATED : August 4, 1998
INVENTOR(S) : Michele Palmieri, et al It is certified that error appears in the above-identified patent and that said Letters Patent is hereby corrected as shown below:

Col. 2, line 50, "$cm^{-7}$" should be --$cm^{-2}$--

Col. 2, line 53, "surface of the monocrystaline silicon, from being subject to"
should be --surface of the monocrystaline silicon from being subject to--

Col. 5, line 30, "DMos" should be --DMOS--

Signed and Sealed this

Fifth Day of January, 1999

*Attest:*

*Attesting Officer*

*Acting Commissioner of Patents and Trademarks*